US011267762B2

(12) United States Patent
Li et al.

(10) Patent No.: US 11,267,762 B2
(45) Date of Patent: Mar. 8, 2022

(54) PREPARATION METHOD FOR CERAMIC COMPOSITE MATERIAL, CERAMIC COMPOSITE MATERIAL, AND WAVELENGTH CONVERTER

(71) Applicant: APPOTRONICS CORPORATION LIMITED, Guangdong (CN)

(72) Inventors: Qian Li, Guangdong (CN); Yanzheng Xu, Guangdong (CN)

(73) Assignee: APPOTRONICS CORPORATION LIMITED, Guangdong (CN)

( * ) Notice: Subject to any disclaimer, the term of this patent is extended or adjusted under 35 U.S.C. 154(b) by 180 days.

(21) Appl. No.: 16/468,112

(22) PCT Filed: Nov. 3, 2017

(86) PCT No.: PCT/CN2017/109317
§ 371 (c)(1),
(2) Date: Jun. 10, 2019

(87) PCT Pub. No.: WO2018/103481
PCT Pub. Date: Jun. 14, 2018

(65) Prior Publication Data
US 2020/0123063 A1 Apr. 23, 2020

(30) Foreign Application Priority Data
Dec. 9, 2016 (CN) .......................... 201611135583.4

(51) Int. Cl.
| | |
|---|---|
| *C01F 7/02* | (2006.01) |
| *C04B 35/628* | (2006.01) |
| *C01F 7/028* | (2022.01) |
| *C04B 35/113* | (2006.01) |
| *C04B 35/117* | (2006.01) |
| *C04B 35/195* | (2006.01) |
| *B01J 8/00* | (2006.01) |

(52) U.S. Cl.
CPC ......... *C04B 35/62813* (2013.01); *B01J 8/008* (2013.01); *C01F 7/028* (2013.01); *C04B 35/113* (2013.01); *C04B 35/117* (2013.01); *C04B 35/195* (2013.01); *B01J 2208/00017* (2013.01); *B01J 2208/00805* (2013.01); *C04B 2235/3225* (2013.01); *C04B 2235/786* (2013.01)

(58) Field of Classification Search
None
See application file for complete search history.

(56) References Cited

U.S. PATENT DOCUMENTS

| | | | |
|---|---|---|---|
| 6,150,757 A | 11/2000 | Ronda et al. | |
| 9,045,691 B2 | 6/2015 | Irie | |
| 2010/0061077 A1* | 3/2010 | Winkler | C09K 11/7774 362/84 |
| 2015/0041712 A1 | 2/2015 | Winkler et al. | |

FOREIGN PATENT DOCUMENTS

| | | |
|---|---|---|
| CN | 105753457 | 7/2016 |
| CN | 105906328 | 8/2016 |
| CN | 106206904 | 12/2016 |
| JP | 2016204561 | 12/2016 |
| KR | 20140114732 A * | 9/2014 |
| WO | 2006097876 | 9/2006 |

OTHER PUBLICATIONS

International Search Report for International Application PCT/CN2017/109317, dated Feb. 9, 2018.
Supplementary European Search Report for European Application 17879386.5, dated Jul. 2, 2020.
Shuxing, et al., Al2O3—YAG:Ce composite phosphor ceramic: a thermally robust and efficient color converter for solid state laser lighting, Journal of Materials Chemistry C, pp. 8648-8654, vol. 4(37), The Royal Society of Chemistry, Oct. 7, 2016.
Tang, et al., Composite phase ceramic phosphor of Al2O3—Ce:YAG for high efficiency light emitting, Optics Express, pp. 17923-17928, vol. 23(14), Jul. 13, 2015.

* cited by examiner

*Primary Examiner* — Alexander M Weddle
(74) *Attorney, Agent, or Firm* — Burris Law, PLLC

(57) ABSTRACT

A preparation method for a ceramic composite material, a ceramic composite material, and a wavelength converter. The preparation method comprises: preparing an aluminium salt solution and a fluorescent powder; dispersing the fluorescent powder into a buffer solution having a pH 4.5-5.5 to obtain a suspension; titrating the suspension with the aluminium salt solution to obtain a fluorescent powder coated with $Al_2O_3$ hydrate film; calcining the fluorescent powder coated with $Al_2O_3$ hydrate film to obtain a $Al_2O_3$-coated fluorescent powder; mixing aluminium oxide powder with a particle size of 0.1 μm-1 μm and aluminium oxide powder with a particle size of 1 μm-10 μm to obtain mixed aluminium oxide powder; mixing the $Al_2O_3$-coated fluorescent powder and the mixed aluminium oxide powder to obtain mixed powder, the $Al_2O_3$-coated fluorescent powder being present in 40%-90% by weight of the mixed powder; and pre-pressing and sintering the mixed powder to obtain the ceramic composite material.

13 Claims, No Drawings

PREPARATION METHOD FOR CERAMIC COMPOSITE MATERIAL, CERAMIC COMPOSITE MATERIAL, AND WAVELENGTH CONVERTER

CROSS-REFERENCE TO RELATED APPLICATIONS

The present application is based on International Application No. PCT/CN2017/109317, filed on Nov. 3, 2017, which claims priority to Chinese Patent Application No. 201611135583.4, filed on Dec. 9, 2016, the contents of which are incorporated herein by reference in their entireties.

FIELD

The present disclosure relates to the technical field of light-emitting materials, and in particular, to a method for preparing a ceramic composite material, a ceramic composite material as well as a wavelength converter.

BACKGROUND

The statements in this section merely provide background information related to the present disclosure and may not constitute prior art.

In the field of light-emitting displays, a fluorescent powder encapsulation of a wavelength conversion device is mainly an encapsulation of an organic resin, an organic silica gel and an inorganic glass, and in such a technical solution, the wavelength conversion device has poor thermal conductivity and heat resistance. Accordingly, it is known that the fluorescent powder and light-permeable inorganic ceramics are sintered together to obtain a ceramic composite material, which has properties of excellent thermal conductivity and heat resistance.

At present, for the ceramic composite material in which the fluorescent powder is encapsulated by $Al_2O_3$, a weak binding force between a fluorescent powder phase and an $Al_2O_3$ phase may result in poor mechanical performances. Moreover, most ceramic composite materials also have or exhibit a low lighting effect, particles of the fluorescent powder being pulled out during processing, and/or difficulty in surface polishing, which may affect the performances of the ceramic composite material.

SUMMARY

The present disclosure provides a method for preparing a ceramic composite material with a, high lighting effect, high thermal conductivity and high mechanical performances.

The method for preparing the ceramic composite material provided by the present disclosure includes:

preparing an aluminum salt solution and a fluorescent powder according to a mass ratio of $Al_2O_3$ to fluorescent powder of (0.1 to 1):100;

dispersing the fluorescent powder in a buffer solution with a pH value of 4.5 to 5.5 to obtain a suspension;

titrating the suspension with the aluminum salt solution to obtain a fluorescent powder coated with an $Al_2O_3$ hydrate film;

calcining the fluorescent powder coated with the $Al_2O_3$ hydrate film to obtain an $Al_2O_3$-coated fluorescent powder;

mixing an alumina powder having a particle diameter of 0.1 μm to 1 μm and an alumina powder having a particle diameter of 1 μm to 10 μm according to a molar ratio of 100:(0.1 to 5), so as to obtain a mixed alumina powder;

mixing the $Al_2O_3$-coated fluorescent powder and the mixed alumina powder to obtain a mixed powder, in which the $Al_2O_3$-coated fluorescent powder accounts for 40% to 90% by weight of the mixed powder; and pre-pressing and sintering the mixed powder to obtain the ceramic composite material.

Optionally, the fluorescent powder comprises at least one $Ce^{3+}$-doped fluorescent powder selected from the group consisting of $Ca_3Al_2Si_3O_{12}$, $Ca_3Sc_2Si_3O_{12}$, $Gd_3Al_5O_{12}$, $Gd_3Ga_5O_{12}$, $Tb_3Al_5O_{12}$, $Tb_3Ga_5O_{12}$, $Y_3Al_5O_{12}$, $Y_3Ga_5O_{12}$, $Lu_3Al_5O_{12}$, $Lu_3Ga_5O_{12}$ and $Y_3Mg_2AlSi_2O_{12}$.

Optionally, the fluorescent powder has a particle diameter in a range of 13 μm to 20 μm.

Optionally, the aluminum salt solution has a concentration of 0.01 mol/L to 1 mol/L.

Optionally, in the step of titrating the suspension with the aluminum salt solution, a temperature of the suspension is in a range of 40° C. to 70° C., a stirring rate is in a range of 100 revolutions per minute (r/min) to 300 r/min, and a titrating rate is in a range of 5 milliliters per minute (mL/min) to 50 mL/min.

Optionally, in the step of calcining, a calcination temperature is in a range of 300° C. to 600° C., and a calcination duration is in a range of 2 hours (h) to 5 h.

Optionally, the step of pre-pressing is carried out under a pressure of 5 megapascals (MPa) to 15 MPa.

Optionally, the step of sintering is carried out in an argon atmosphere, here, a sintering temperature is in a range of 1250° C. to 1550° C., a holding time is in a range of 30 min to 360 min, and a sintering pressure is in a range of 30 MPa to 200 MPa.

Optionally, in the step of mixing the alumina powder having a particle diameter of 0.1 micrometer (μm) to 1 μm and the alumina powder having a particle diameter of 1 μm to 10 μm according to the molar ratio of 100:(0.1 to 5), an alumina powder having a particle diameter of 0.01 μm to 0.1 μm is additionally added, here, a molar ratio of the alumina powder of 0.01 μm to 0.1 μm to the alumina powder of 0.1 μm to 1 μm is (0.1 to 1):100.

Optionally, the step of mixing the $Al_2O_3$-coated fluorescent powder and the mixed alumina powder includes:

dispersing the mixed alumina powder into a polyethylene glycol (PEG) 4000-ethanol solution having a concentration of 1% to 3% by weight, placing the obtained mixture into a ball-milling tank and performing ball-milling for 6 h to 24 h; and adding the $Al_2O_3$-coated fluorescent powder into the ball-milling tank, and further performing ball-milling for 30 min to 60 min.

The present disclosure further provides a ceramic composite material, including an alumina matrix, a fluorescent powder uniformly distributed in the alumina matrix, and scattering centers uniformly distributed in the alumina matrix. The alumina matrix is an alumina ceramics, the scattering centers are alumina particles, the alumina particles each have a particle diameter of 1 μm to 10 μm, and the fluorescent powder has a particle diameter of 13 μm to 20 μm.

The present disclosure further provides a wavelength converter, including the ceramic composite material described above.

According to the teachings of the present disclosure, the fluorescent powder particles can be firstly coated with a small amount of $Al_2O_3$ particles having a small particle diameter (i.e., an $Al_2O_3$ film) by means of liquid phase deposition, and then the obtained product is mixed with $Al_2O_3$ particles having a medium particle diameter and $Al_2O_3$ particles having a large particle diameter, so that the small amount of $Al_2O_3$ particles having the small particle diameter and coated on the fluorescent powder particle (i.e., an $Al_2O_3$ film) can be first transformed into a liquid phase during the sintering, thereby improving a sinterability of the ceramic composite material, and effectively enhancing a bonding force between the fluorescent powder phase and the $Al_2O_3$ phase in the ceramic composite material. At the same time, through the dissolution and re-deposition mechanism, the abnormal growth of the $Al_2O_3$ particles having the medium particle diameter can be effectively suppressed during the sintering, thereby improving the performances of the $Al_2O_3$ matrix. The $Al_2O_3$ particles having the large particle diameter can be used as scattering particles in the ceramic composite material. In this way, a ceramic composite material having high lighting effect, high thermal conductivity, high mechanical performances, and adjustable blue light permeability can be prepared.

Further areas of applicability will become apparent from the description provided herein. It should be understood that the description and specific examples are intended for purposes of illustration only and are not intended to limit the scope of the present disclosure.

DETAILED DESCRIPTION

The following description is merely exemplary in nature and is not intended to limit the present disclosure, application, or uses. It should be understood that throughout the drawings, corresponding reference numerals indicate like or corresponding parts and features.

Forms of the present disclosure will be described in details as follow. It is obvious that the described forms are merely parts of rather than all of the forms of the present disclosure. On basis of the forms described in the present disclosure, all other forms obtained by those skilled in the art without creative efforts shall fall within the protection scope of the present disclosure.

In addition, individual forms can be combined with each other under a premise of realizability for those skilled in the art. If a combination of forms is contradictory or impossible to implement, it should be considered that the combination of forms does not exist and shall not fall within the protection scope of the present disclosure.

The present disclosure provides a method for preparing a ceramic composite material, in order to prepare a ceramic composite material having high lighting effect, thermal conductivity, mechanical performances and adjustable blue light permeability, which the ceramic composite can be applied to a laser light source having a high performance.

The method for preparing the ceramic composite material includes the following steps.

In step S100, an aluminum salt solution and a fluorescent powder are prepared according to a mass ratio of $Al_2O_3$ to fluorescent powder of (0.1 to 1):100.

In this step, the fluorescent powder is a $Ce^{3+}$-doped fluorescent powder selected from at least one of $Ca_3Al_2Si_3O_{12}$, $Ca_3Sc_2Si_3O_{12}$, $Gd_3Al_5O_{12}$, $Gd_3Ga_5O_{12}$, $Tb_3Al_5O_{12}$, $Tb_3Ga_5O_{12}$, $Y_3Al_5O_{12}$, $Y_3Ga_5O_{12}$, $Lu_3Al_5O_{12}$, $Lu_3Ga_5O_{12}$ and $Y_3Mg_2AlSi_2O_{12}$. Moreover, the fluorescent powder has a particle diameter in a range of 13 µm to 20 µm, preferably 15 µm to 17 µm.

A concentration of the aluminum salt solution is in a range of 0.01 mol/L to 1 mol/L, preferably 0.2 mol/L to 0.5 mol/L.

An aluminum nitrate solution can be used as the aluminum salt solution.

It should be understood that, when actually preparing the aluminum salt solution and the fluorescent powder, a mass ratio of $Al_2O_3$ to the fluorescent powder is firstly determined, and then a certain mass of the fluorescent powder is weighted; according to the mass of the fluorescent powder and the mass ratio of $Al_2O_3$ to the fluorescent powder, a desired mass of the $Al_2O_3$ is calculated, and thus a mole number of $Al^{3+}$ can be obtained by conversion; a corresponding mass of aluminum salt can be calculated according to the mole number of $Al^{3+}$; and finally, the corresponding mass of aluminum salt is weighted to prepare the aluminum salt solution. In this way, the aluminum salt solution and the fluorescent powder are prepared, respectively.

In step S200, the fluorescent powder is dispersed in a buffer solution having a pH 4.5 to 5.5 to obtain a suspension. In this step, a citric acid-sodium hydroxide solution can be used as the buffer solution, and the citric acid-sodium hydroxide solution includes citric acid with a concentration in a range of 0.8 mol/L to 1.2 mol/L.

In addition, before dispersing the fluorescent powder in the buffer solution, 1 wt % to 3 wt % of PEG 4000 is pre-added into the buffer solution.

In step S300, the suspension is titrated with the aluminum salt solution to obtain a fluorescent powder coated with an $Al_2O_3$ hydrate film.

In this step, during the process of titrating, the suspension has a temperature in a range of 40° C. to 70° C., and a stirring rate is in a range of 100 r/min to 300 r/min, and a titrating rate is in a range of 5 mL/min to 50 mL/min.

After the titrating, the above temperature and stirring are maintained for 1 h to 2 h, following by adjusting the pH value into a range of 6 to 7 with a sodium hydroxide solution.

In step S400, the fluorescent powder coated with the $Al_2O_3$ hydrate film is calcined to obtain an $Al_2O_3$-coated fluorescent powder.

Before the calcining, the step includes:

Centrifuging the fluorescent powder coated with the $Al_2O_3$ hydrate film;

Repeating steps of washing the obtained fluorescent powder coated with the $Al_2O_3$ hydrate film with water and then dehydrating the fluorescent powder coated with the $Al_2O_3$ hydrate film for 3 to 5 times, and then drying at a temperature in a range of 75° C. to 85° C.

During the calcining, a calcination temperature is in a range of 300° C. to 600° C., and a calcination duration is in a range of 2 h to 5 h.

It should be noted that after calcining, the surface of the fluorescent powder is coated with $Al_2O_3$ particle having a small particle diameter.

In step S500, an alumina powder having a particle diameter of 0.1 µm to 1 µm and an alumina powder having a particle diameter of 1 µm to 10 µm are mixed according to a molar ratio of 100:(0.1 to 5), so as to obtain a mixed alumina powder.

In this step, the alumina powder having a particle diameter of 0.1 µm to 1 µm (i.e., $Al_2O_3$ particles having a medium particle diameter) preferably has a particle diameter from 0.1 µm to 0.3 µm.

The alumina powder having a particle diameter of 1 µm to 10 µm (i.e., the $Al_2O_3$ particles having a large particle diameter) preferably has a particle diameter from 3 µm to 5 µm.

Further, an alumina powder having a particle diameter of 0.01 µm to 0.1 µm, preferably a particle diameter of 0.02 µm to 0.05 µm may also be added into the mixed alumina powder, and a molar ratio of the aluminum powder having a particle diameter of 0.01 µm to 0.1 µm to the alumina powder having a particle diameter of 0.1 µm to 1 µm is (0.1-1):100.

In step S600, the $Al_2O_3$-coated fluorescent powder and the mixed alumina powder are mixed to obtain a mixed powder, in which the $Al_2O_3$-coated fluorescent powder accounts for 40% to 90% by weight of the mixed powder.

In at least one variation the $Al_2O_3$-coated fluorescent powder accounts for 50% to 70% by weight of the mixed powder.

The step of mixing the $Al_2O_3$-coated fluorescent powder and the mixed alumina powder includes:

Dispersing the mixed alumina powder into a PEG 4000-ethanol solution having a concentration of 1% to 3% by weight, and placing it into a ball-milling tank to perform ball-milling for 6 h to 24 h;

Adding the $Al_2O_3$-coated fluorescent powder into the ball-milling tank to further perform the ball-milling for 30 min to 60 min.

In step S700, the mixed powder is pre-pressed and sintered, so as to obtain the ceramic composite material.

The pre-pressing is carried out under a pressure of 5 MPa to 15 MPa.

The sintering is carried out in an argon atmosphere, a sintering temperature is in a range of 1250° C. to 1550° C., a holding time is in a range of 30 min to 360 min, and a sintering pressure is in a range of 30 MPa to 200 MPa. In at least one variation of the present disclosure the sintering pressure is in a range of 40 MPa to 100 MPa.

It should be noted that, by properly controlling the sintering temperature during the sintering process, the $Al_2O_3$ particles having a small particle diameter and the $Al_2O_3$ particles having a medium particle diameter can be completely transformed into a liquid phase to be sintered, and the $Al_2O_3$ particles having a large particle diameter are partially or not sintered, while the fluorescent powder is not sintered. Here, a grain form and grain particle diameter of the fluorescent powder do not change. A grain form of the $Al_2O_3$ particles having the large particle diameter turns to a phase from another phase, and a diameter thereof increases due to a dissolution and re-deposition mechanism.

The dissolution and re-deposition mechanism according to the teachings of the present disclosure is as follows, during the sintering process. The $Al_2O_3$ particles having the small particle diameter are transformed into the liquid phase and fully melted, and then the $Al_2O_3$ particles having the medium particle diameter are partially transformed into the liquid phase. It should be understood that the smaller the particle diameter of the particles, the easier or more likely they can be transformed into a liquid phase. The liquid phase flows in spaces between particles, which is a main way of material migration. When the liquid phase flows over the surface of large particles, small $Al_2O_3$ grains are deposited on the surfaces. It should be noted that, the small $Al_2O_3$ grains are also possible to be deposited on the surface of small particles, but the deposition on the surface of large particles has a greater possibility and a greater degree). In this case, the participated small $Al_2O_3$ grains are classified into two types.

A first type is that the small $Al_2O_3$ grains are deposited on the surfaces of the fluorescent powder particles, since the fluorescent powder is not involved in the sintering, the deposited small $Al_2O_3$ grains and the adjacent $Al_2O_3$ grains go through a process of jointing-fusing-growing via a sintering neck and become an alumina phase closely attached to the fluorescent powder particles.

A second type is that the small $Al_2O_3$ grains are deposited on the surfaces of the $Al_2O_3$ particles having the large particle diameter, and a part of the small $Al_2O_3$ grains is attached to the $Al_2O_3$ particles having the large particle diameter to an extent depending upon the actual temperature, so as to become large particles while absorbing a lot of energy. The continuous growing of the $Al_2O_3$ particles having the large particle diameter actually suppresses an abnormal growth of the $Al_2O_3$ particles having the medium particle diameter, thereby promoting growth uniformity of the majority of the $Al_2O_3$ particles having the medium particle diameter. In this way, the optical performances and mechanical performances can be effectively improved.

In the sintered ceramics, the $Al_2O_3$ particles having the small particle diameter and the $Al_2O_3$ particles having the medium particle diameter form a continuous matrix of ceramics having a certain light permeability, while the fluorescent powder and the $Al_2O_3$ particles having the large particle diameter act as the particles dispersed in the continuous matrix of ceramics and having a scattering effect. Here, the fluorescent powder absorbs the blue light having a short wavelength such as 445 nm to 460 nm, and the $Al_2O_3$ particles having the large particle diameter have a scattering and reflection effect on light having a wavelength in a range of a short wavelength to a visible light wavelength. Moreover, by adjusting a concentration of the $Al_2O_3$ particles having the large particle diameter, the permeability and the scattering degree of the blue light can be changed, thereby changing a color temperature of the ceramic composite material.

Therefore, it can be understood that, according to the teachings of the present disclosure, the fluorescent powder particles are firstly coated with a small amount of $Al_2O_3$ particles having the small particle diameter (i.e., an $Al_2O_3$ film) by means of liquid phase deposition, and the obtained product is mixed with $Al_2O_3$ particles having the medium particle diameter and $Al_2O_3$ particles having the large particle diameter, so that the small amount of $Al_2O_3$ particles having the small particle diameter and coated on the fluorescent powder particle (i.e., the $Al_2O_3$ film) can be first transformed into a liquid phase during the sintering, thereby improving a sinterability of the ceramic composite material, and effectively enhancing a bonding force between the fluorescent powder phase and the $Al_2O_3$ phase in the ceramic composite material. At the same time, through the dissolution and re-deposition mechanism, the abnormal growth of the $Al_2O_3$ particles having the medium particle diameter can be effectively suppressed during the sintering, thereby improving the performances of the $Al_2O_3$ matrix. In the meantime, the $Al_2O_3$ particles having the large particle diameter can be used as scattering particles in the ceramic composite material. In this way, a ceramic composite material having high lighting effect, thermal conductivity, mechanical performances, and adjustable blue light permeability can be prepared.

The teachings of the present disclosure will be described through specific forms below.

Form 1

An appropriate amount of YAG:$Ce^{3+}$ fluorescent powder having a particle diameter of 13 µm to 20 µm is weighted.

According to a mass ratio of $Al_2O_3$ to YAG:$Ce^{3+}$ fluorescent powder of 1:100, a corresponding amount of $Al(NO_3)_3 \cdot 9H_2O$ is weighted to prepare an aluminum nitrate solution with a concentration of 1 mol/L.

A citric acid-sodium hydroxide solution with a pH value of 5.0 and a concentration of 1.0 mol/L is prepared, and then 2 wt % of PEG 4000 is added thereto and dissolved through ultrasonic. Thereafter, YAG:Ce$^{3+}$ fluorescent powder is added, and after ultrasonic dispersion, the mixture is provided with a magnetic stirrer and placed on a magnetic stirring device to be evenly stirred, so as to obtain a fluorescent powder suspension.

The fluorescent powder suspension is heated up to 50° C., and continuously stirred with a stirring rate of 150 r/min, and then the fluorescent powder suspension is titrated with the aluminum nitrate solution at a constant rate of 30 mL/min by using a dropper. After the titration, the temperature and stirring are maintained for 1 h, and then the pH value is adjusted to 6.5 with a sodium hydroxide solution, so as to obtain a YAG:Ce$^{3+}$ fluorescent powder coated with an Al$_2$O$_3$ hydrate film.

The YAG:Ce$^{3+}$ fluorescent powder coated with the Al$_2$O$_3$ hydrate film is centrifuged, washed with water and then dehydrated for three times, dried at 80° C., and then calcined at 500° C. for 5 h, so as to obtain an Al$_2$O$_3$-coated YAG:Ce$^{3+}$ fluorescent powder.

An ultrafine Al$_2$O$_3$ powder with a high purity (having a particle diameter of 0.1 μm to 1 μm) and an Al$_2$O$_3$ powder with a high purity (having a particle diameter of 1 μm to 10 μm) are mixed according to a molar ratio of 100:1, so as to obtain a mixed Al$_2$O$_3$ powder.

A 1 wt % PEG 4000-ethanol solution is prepared, and then the mixed Al$_2$O$_3$ powder is added thereto. After ultrasonic dispersion, the mixture is placed into a teflon ball-milling tank and an appropriate amount of high-purity zirconia balls are added in the ball-milling tank, performing the ball-milling for 12 h. Thereafter, the Al$_2$O$_3$-coated YAG:Ce$^{3+}$ fluorescent powder, which accounts for 50% of the total weight of the powder, is added to the ball-milling tank, followed by performing the ball-milling for 40 min.

A slurry obtained after the ball-milling is vacuum dried, pulverized, and sieved, so as to obtain a mixed powder.

An appropriate amount of the mixed powder is weighted, placed into a graphite mold and pre-pressed under a pressure of 10 MPa. Thereafter, the graphite mold is placed into a hot and pressured sintering furnace and maintained for 60 min in an argon atmosphere, at a sintering temperature of 1250° C., and a sintering pressure of 100 MPa.

After the sintering, the pressure is removed and the mold is cooled together with the furnace, so as to obtain a ceramic composite material YAG:Ce$^{3+}$—Al$_2$O$_3$.

Form 2

An appropriate amount of YAG:Ce$^{3+}$ fluorescent powder having a particle diameter of 13 μm to 20 μm is weighted.

According to a mass ratio of Al$_2$O$_3$ to YAG:Ce$^{3+}$ fluorescent powder of 1:1000, a corresponding amount of Al(NO$_3$)$_3$.9H$_2$O is weighted to prepare an aluminum nitrate solution with a concentration of 0.5 mol/L.

A citric acid-sodium hydroxide solution with a pH value of 5.0 and a concentration of 1.0 mol/L is prepared, and then 3 wt % of PEG 4000 is added thereto and dissolved through ultrasonic. Thereafter, YAG:Ce$^{3+}$ fluorescent powder is added, and after ultrasonic dispersion, the mixture is provided with a magnetic stirrer and placed on a magnetic stirring device to be evenly stirred, so as to obtain a fluorescent powder suspension.

The fluorescent powder suspension is heated up to 65° C., and continuously stirred with a stirring rate of 280 r/min, and then the fluorescent powder suspension is titrated with the aluminum nitrate solution at a constant rate of 45 mL/min by using a dropper. After the titration, the temperature and stirring are maintained for 1 h, and then the pH value is adjusted to 7.0 with a sodium hydroxide solution, so as to obtain a YAG:Ce$^{3+}$ fluorescent powder coated with an Al$_2$O$_3$ hydrate film.

The YAG:Ce$^{3+}$ fluorescent powder coated with the Al$_2$O$_3$ hydrate film is centrifuged, washed with water and then dehydrated for three times, dried at 85° C., and then calcined at 320° C. for 5 h, so as to obtain an Al$_2$O$_3$-coated YAG:Ce$^{3+}$ fluorescent powder.

An ultrafine Al$_2$O$_3$ powder with a high purity (having a particle diameter of 0.01 μm to 0.1 μm), an ultrafine Al$_2$O$_3$ powder with a high purity (having a particle diameter of 0.1 μm to 1 μm) and an Al$_2$O$_3$ powder with a high purity (having a particle diameter of 1 μm to 10 μm) are mixed according to a molar ratio of 1:100:3, so as to obtain a mixed Al$_2$O$_3$ powder.

A 2 wt % PEG 4000-ethanol solution is prepared, and then the mixed Al$_2$O$_3$ powder is added thereto. After ultrasonic dispersion, it is placed into a teflon ball-milling tank, and then an appropriate amount of high-purity zirconia balls are added in the ball-milling tank, performing the ball-milling for 24 h. Thereafter, the Al$_2$O$_3$-coated YAG:Ce$^{3+}$ fluorescent powder, which accounts for 70% of the total weight of the powder, is added to the ball-milling tank, followed by performing the ball-milling for 60 min.

A slurry obtained after the ball-milling is vacuum dried, pulverized, and sieved, so as to obtain a mixed powder.

An appropriate amount of the mixed powder is weighted, placed into a graphite mold and pre-pressed under a pressure of 15 MPa. Thereafter, the graphite mold is placed into a hot and pressured sintering furnace and maintained for 300 min in an argon atmosphere, at a sintering temperature of 1500° C., and a sintering pressure of 60 MPa.

After the sintering, the pressure is removed and the mold is cooled together with the furnace, so as to obtain a ceramic composite material YAG:Ce$^{3+}$—Al$_2$O$_3$.

Form 3

An appropriate amount of LuAG:Ce$^{3+}$ fluorescent powder having a particle diameter of 13 μm to 20 μm is weighted.

According to a mass ratio of Al$_2$O$_3$ to LuAG:Ce$^{3+}$ fluorescent powder of 1:500, a corresponding amount of Al(NO$_3$)$_3$.9H$_2$O is weighted to prepare an aluminum nitrate solution with a concentration of 0.3 mol/L.

A citric acid-sodium hydroxide solution with a pH value of 5.0 and a concentration of 1.0 mol/L is prepared, and then 1 wt % of PEG 4000 is added thereto and dissolved through ultrasonic. Thereafter, LuAG:Ce$^{3+}$ fluorescent powder is added, and after ultrasonic dispersion, the mixture is provided with a magnetic stirrer and placed on a magnetic stirring device to be evenly stirred, so as to obtain a fluorescent powder suspension.

The fluorescent powder suspension is heated up to 40° C., and continuously stirred with a stirring rate of 110 r/min. Thereafter, the fluorescent powder suspension is titrated with the aluminum nitrate solution at a constant rate of 15 mL/min by using a dropper. After the titration, the temperature and stirring are maintained for 1 h, and then the pH value is adjusted to 7.0 with a sodium hydroxide solution, so as to obtain a LuAG:Ce$^{3+}$ fluorescent powder coated with an Al$_2$O$_3$ hydrate film.

The LuAG:Ce$^{3+}$ fluorescent powder coated with the Al$_2$O$_3$ hydrate film is centrifuged, washed with water and then dehydrated for four times, dried at 80° C., and then calcined at 300° C. for 5 h, so as to obtain an Al$_2$O$_3$-coated LuAG:Ce$^{3+}$ fluorescent powder.

An ultrafine Al$_2$O$_3$ powder with a high purity (having a particle diameter of 0.1 μm to 1 μm) and an Al$_2$O$_3$ powder with a high purity (having a particle diameter of 1 μm to 10 μm) are mixed according to a molar ratio of 20:1, so as to obtain a mixed $Al_2O_3$ powder.

A 3 wt % PEG 4000-ethanol solution is prepared, and then the mixed $Al_2O_3$ powder is added thereto. After ultrasonic dispersion, the mixture is placed into a teflon ball-milling tank, and then an appropriate amount of high-purity zirconia balls are added in the ball-milling tank, performing the ball-milling lasts for 8 h. Thereafter, the $Al_2O_3$-coated $LuAG:Ce^{3+}$ fluorescent powder, which accounts for 45% of the total weight of the powder, is added to the ball-milling tank, followed by performing the ball-milling for 30 min.

A slurry obtained after the ball-milling is vacuum dried, pulverized, and sieved, so as to obtain a mixed powder.

An appropriate amount of the mixed powder is weighted, placed into a graphite mold and pre-pressed under a pressure of 5 MPa. Thereafter, the graphite mold is placed into a hot and pressured sintering furnace and maintained for 180 min in an argon atmosphere, at a sintering temperature of 1300° C., and a sintering pressure of 50 MPa.

After sintering, the pressure is removed and the mold is cooled together with the furnace, so as to obtain a ceramic composite material $LuAG:Ce^{3+}$—$Al_2O_3$.

It should be noted that, during the preparation of the ceramic composite material with the processes described in Forms 1 to 3, a ternary system of the alumina particles facilitates the sintering process of the ceramic composite material. In the ternary system, the small alumina particles can serve as a co-solvent, and the large alumina particles can not only improve a filling efficiency during powder filling, but ameliorate liquid phase sintering and inhibit the abnormal growth of grains during the sintering. Moreover, the large alumina particles also has a scattering effect on light, and the light permeability and light reflectivity of the ceramic composite material with respect to the excited blue light can be changed by adjusting the amount of large alumina particles, thereby adjusting a color temperature of the ceramic composite material. Moreover, during the sintering, the ternary system also contributes to improving the bonding between the fluorescent powder particle and the alumina matrix, thereby improving the mechanical performances of the ceramic composite material.

Therefore, by preparing the ceramic composite material with the processes described in Forms 1 to 3, the ceramic composite can have high lighting effect, thermal conductivity, mechanical performances, and adjustable blue light permeability, and thus can be applied to a laser source having a high performance, especially a miniaturized laser source system.

The present disclosure further provides a ceramic composite material including an alumina matrix, a fluorescent powder uniformly distributed in the alumina matrix, and scattering centers uniformly distributed in the alumina matrix. The alumina matrix is a continuous alumina ceramics, the scattering centers are alumina particles, the alumina particles each have a particle diameter in a range of 1 μm to 10 μm, and the fluorescent powder has a particle diameter in a range of 13 μm to 20 μm.

The ceramic composite material has high temperature resistance, good thermal conductivity, and excellent mechanical performances.

The present disclosure further provides a wavelength converter, including the ceramic composite material as described above. Since the wavelength converter adopts some or all the teachings described in the above forms, it possesses at least all the beneficial effects of the teachings described in the above forms, which will not be repeatedly described herein. The wavelength converter can be applied in a stationary installation environment, as well as in a moving device (such as a wavelength conversion color wheel). The wavelength converter can be applied to the lighting field, for example, various lighting devices such as a street lamp, a searchlight, a stage light, and a car headlight. The wavelength converter can also be applied to a display system, such as a projector, a televisions, etc., and satisfy all requirements thereof.

The above description is merely preferred forms of the present disclosure, but not intended to limit a scope of the present disclosure. Under the concepts of the present disclosure, any equivalent structural substitution or any direct/indirect application in other relevant technical fields shall fall within the patent protection scope of the present disclosure.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice; material, manufacturing, and assembly tolerances; and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A method for preparing a ceramic composite material, comprising:
    preparing an aluminum salt solution and a fluorescent powder according to a mass ratio of $Al_2O_3$ to fluorescent powder of (0.1 to 1):100;
    dispersing the fluorescent powder in a buffer solution with a pH value of 4.5 to 5.5 to obtain a suspension;
    titrating the suspension with the aluminum salt solution to obtain a fluorescent powder coated with an $Al_2O_3$ hydrate film;
    calcining the fluorescent powder coated with the $Al_2O_3$ hydrate film to obtain an $Al_2O_3$-coated fluorescent powder;
    mixing an alumina powder having a particle diameter of 0.1 μm to 1 μm and an alumina powder having a particle diameter of 1 μm to 10 μm according to a molar ratio of 100:(0.1 to 5), so as to obtain a mixed alumina powder;
    mixing the $Al_2O_3$-coated fluorescent powder and the mixed alumina powder to obtain a mixed powder, wherein the $Al_2O_3$-coated fluorescent powder accounts for 40% to 90% by weight of the mixed powder; and
    pre-pressing and sintering the mixed powder to obtain the ceramic composite material.

2. The method for preparing the ceramic composite material according to claim 1, wherein the fluorescent powder comprises at least one $Ce^{3+}$-doped fluorescent powder selected from the group consisting of $Ca_3Al_2Si_3O_{12}$, $Ca_3Sc_2Si_3O_{12}$, $Gd_3Al_5O_{12}$, $Gd_3Ga_5O_{12}$, $Tb_3Al_5O_{12}$, $Tb_3Ga_5O_{12}$, $Y_3Al_5O_{12}$, $Y_3Ga_5O_{12}$, $Lu_3Al_5O_{12}$, $Lu_3Ga_5O_{12}$ and $Y_3Mg_2AlSi_2O_{12}$.

3. The method for preparing the ceramic composite material according to claim 2, wherein the fluorescent powder has a particle diameter in a range of 13 μm to 20 μm.

4. The method for preparing the ceramic composite material according to claim 1, wherein the aluminum salt solution has a concentration of 0.01 mol/L to 1 mol/L.

5. The method for preparing the ceramic composite material according to claim 1, wherein in the step of titrating the suspension with the aluminum salt solution, a temperature of the suspension is in a range of 40° C. to 70° C., a stirring frequency is in a range of 100 r/min to 300 r/min, and a titrating rate is in a range of 5 mL/min to 50 mL/min.

6. The method for preparing the ceramic composite material according to claim 5, after finishing the step of titrating the suspension with the aluminum salt solution, further comprising:
    maintaining the temperature of the suspension and stirring for 1 h to 2 h, and adjusting a pH value into a range of 6 to 7 with a sodium hydroxide solution.

7. The method for preparing the ceramic composite material according to claim 5, before the step of calcining the fluorescent powder coated with the $Al_2O_3$ hydrate film to obtain an $Al_2O_3$-coated fluorescent powder, further comprising:
    centrifuging the fluorescent powder coated with the $Al_2O_3$ hydrate film;
    repeating steps of washing the fluorescent powder coated with the $Al_2O_3$ hydrate film with water and then dehydrating the fluorescent powder coated with the $Al_2O_3$ hydrate film for 3 to 5 times, and then drying at a temperature in a range of 75° C. to 85° C.

8. The method for preparing the ceramic composite material according to claim 1, wherein a calcination temperature is in a range of 300° C. to 600° C., and a calcination duration is in a range of 2 h to 5 h.

9. The method for preparing the ceramic composite material according to claim 1, wherein the step of pre-pressing is carried out under a pressure of 5 MPa to 15 MPa.

10. The method for preparing the ceramic composite material according to claim 1, wherein the sintering is carried out in an argon atmosphere, a sintering temperature is in a range of 1250° C. to 1550° C., a holding time is in a range of 30 min to 360 min, and a sintering pressure is in a range of 30 MPa to 200 MPa.

11. The method for preparing the ceramic composite material according to claim 1, wherein in the step of mixing the alumina powder having a particle diameter of 0.1 μm to 1 μm and the alumina powder having a particle diameter of 1 μm to 10 μm according to the molar ratio of 100:(0.1 to 5), an alumina powder having a particle diameter of 0.01 μm to 0.1 μm is additionally added, wherein a molar ratio of the alumina powder of 0.01 μm to 0.1 μm to the alumina powder of 0.1 μm to 1 μm is (0.1 to 1):100.

12. The method for preparing the ceramic composite material according to claim 1, wherein the step of mixing the $Al_2O_3$-coated fluorescent powder and the mixed alumina powder comprises:
    dispersing the mixed alumina powder into a PEG 4000-ethanol solution having a concentration of 1% to 3% by weight, placing the obtained mixture into a ball-milling tank and performing ball-milling for 6 h to 24 h; and
    adding the $Al_2O_3$-coated fluorescent powder into the ball-milling tank, and further performing ball-milling for 30 min to 60 min.

13. The method for preparing the ceramic composite material according to claim 1, wherein the $Al_2O_3$-coated fluorescent powder accounts for 50% to 70% by weight of the mixed powder.

* * * * *